United States Patent
Wang et al.

(10) Patent No.: US 9,159,724 B2
(45) Date of Patent: Oct. 13, 2015

(54) CROSS-COUPLING-BASED DESIGN USING DIFFUSION CONTACT STRUCTURES

(71) Applicant: GLOBALFOUNDRIES Inc., Grand Cayman (KY)

(72) Inventors: Yan Wang, San Jose, CA (US); Yuansheng Ma, Santa Clara, CA (US); Jongwook Kye, Pleasanton, CA (US); Mahbub Rashed, Cupertino, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 60 days.

(21) Appl. No.: 14/161,063

(22) Filed: Jan. 22, 2014

(65) Prior Publication Data
US 2014/0131816 A1 May 15, 2014

Related U.S. Application Data

(62) Division of application No. 13/465,134, filed on May 7, 2012, now Pat. No. 8,679,911.

(51) Int. Cl.
*H01L 29/40* (2006.01)
*H01L 27/088* (2006.01)
*H01L 21/8234* (2006.01)
*H01L 27/02* (2006.01)
*H01L 21/768* (2006.01)
*H01L 21/8238* (2006.01)
*H01L 27/092* (2006.01)

(52) U.S. Cl.
CPC ........ *H01L 27/088* (2013.01); *H01L 21/76895* (2013.01); *H01L 21/823475* (2013.01); *H01L 27/0207* (2013.01); *H01L 21/823871* (2013.01); *H01L 27/092* (2013.01)

(58) Field of Classification Search
CPC ..... H01L 27/097; H01L 21/768; H01L 29/78; H01L 27/088; H01L 21/823475; H01L 21/823871
USPC .......... 257/288, 368, 369, 773; 438/151, 197, 438/199; 716/119
See application file for complete search history.

(56) References Cited

U.S. PATENT DOCUMENTS

| | | | | |
|---|---|---|---|---|
| 3,886,583 | A * | 5/1975 | Wang | 257/407 |
| 2012/0319167 | A1* | 12/2012 | van Dal et al. | 257/192 |
| 2013/0062701 | A1* | 3/2013 | Lee et al. | 257/369 |

\* cited by examiner

*Primary Examiner* — Jarrett Stark
*Assistant Examiner* — Shahed Ahmed
(74) *Attorney, Agent, or Firm* — Ditthavong & Steiner, P.C.

(57) ABSTRACT

An approach for providing cross-coupling-based designs using diffusion contact structures is disclosed. Embodiments include providing first and second gate structures over a substrate; providing a gate cut region across the first gate structure, the second gate structure, or a combination thereof; providing a first gate contact over the first gate structure; providing a second gate contact over the second gate structure; and providing a diffusion contact structure coupling the first gate contact to the second gate contact, the diffusion contact structure having vertices within the gate cut region.

20 Claims, 3 Drawing Sheets

12
CROSS-COUPLING-BASED DESIGN USING DIFFUSION CONTACT STRUCTURES

CROSS-REFERENCE TO RELATED APPLICATION

This application is a division of U.S. patent application Ser. No. 13/465,134 filed May 7, 2012, the entirety of which is incorporated herein by reference.

TECHNICAL FIELD

The present disclosure relates to cross-coupling-based designs. The present disclosure is particularly applicable to designs in 14 nanometer (nm) technology nodes and beyond.

BACKGROUND

Cross-coupling gate contact structures are important for standard cell design to achieve product area scaling goals of advanced technology nodes. However, as technology advances (e.g., 14 nm technology nodes and beyond), it may be difficult to construct a cross-coupling gate structure within a two-gate pitch region using traditional methods.

FIG. 1 schematically illustrates a typical cross-coupling-based design. As shown, the design in FIG. 1 includes gate structures 101 over one or more diffusion regions 103 having one or more diffusion contact structures 105, gate contact structures 107 (gate contact structures 107a through 107c) over gate structures 101, and via structures 109 (e.g., via0) to couple some of the gate contact structures 107 to the metal routing layer (e.g., metal1 routing layer) (not shown for illustrative convenience). To separate gate contact structures 107, portions of some of the gate structures 101 are cut by gate cut regions 111. As illustrated, the design in FIG. 1 utilizes two gate cut regions 111 and one straight gate contact structure 107 over two gate structures 101 to achieve the cross-coupling-based design. Based on this design, for instance, for 20 nm technology nodes, two-gate pitch region 113 (which encompasses the gate contact structures 107) may be 140 nm to 200 nm in width (e.g., indicator 115) and 200 nm to 230 nm in length (e.g., indicator 117).

FIG. 2 schematically illustrates another cross-coupling-based design. As shown, the design in FIG. 2 similarly includes gate structures 201 over one or more diffusion regions 203 having one or more diffusion contact structures 205, gate contact structures 207 (e.g., gate contact structures 207a through 207d) over gate structures 201, and via structures 209 to couple some of the gate contact structures 207 to the metal routing layer (not shown for illustrative convenience). As depicted, the design in FIG. 2 utilizes one gate cut region 211 to separate the gate contact structures 207 (as opposed to using two gate cut regions 111 for the design in FIG. 1), and diffusion contact structure 213 to couple gate contact structure 207b on one gate structure 201 on one side of the gate cut region 211 to gate contact structure 207c on another gate structure 201 on the opposite side of the gate cut region 211. In this example, two-gate pitch region 215 may, for instance, be 140 nm to 200 nm in width (e.g., indicator 217) and 300 nm in length (e.g., indicator 219).

As technology advances, the designs in FIGS. 1 and 2 may result in low diffusion efficiency, for instance, due to the lengths of the two-gate pitch regions 113 and 215. Consequently, this low diffusion efficiency reduces the drive strength of the standard cell, negatively impacting its performance. In addition, the complicated gate contact structures in FIGS. 1 and 2 (e.g., complicated with respect to patterning) may impose yield or reliability concerns as technology advances as a result of shorter spacing between adjacent gate structures.

A need therefore exists for more effective and efficient cross-coupling-based designs, such as designs utilizing diffusion contact structures for cross-coupling, and enabling methodology.

SUMMARY

An aspect of the present disclosure is a method for implementing a cross-coupling-based design using diffusion contact structures.

Another aspect of the present disclosure is a device implemented with a cross-coupling-based design using diffusion contact structures.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing first and second gate structures over a substrate; providing a gate cut region across the first gate structure, the second gate structure, or a combination thereof; providing a first gate contact over the first gate structure; providing a second gate contact over the second gate structure; and providing a diffusion contact structure coupling the first gate contact to the second gate contact, the diffusion contact structure having vertices within the gate cut region.

Aspects of the present disclosure include providing the diffusion contact structure by: providing a first diffusion contact portion over the first gate structure; providing a second diffusion contact portion within the gate cut region; and providing a third diffusion contact portion over the second gate structure. Additional aspects include: coupling the first diffusion contact portion to a first side of the second diffusion contact portion; and coupling the third diffusion contact portion to a second side of the second diffusion contact portion, wherein the second side is opposite the first side. Certain aspects include: coupling the first diffusion contact portion to the first gate contact; and coupling the third diffusion contact portion to the second gate contact. Some aspects include the second diffusion contact portion being perpendicular to the first diffusion contact portion, the third diffusion contact portion, or a combination thereof. In other aspects, the second diffusion contact portion may not be perpendicular to the first diffusion contact portion, the third diffusion contact portion, or a combination thereof.

Further aspects of the present disclosure include the first gate contact, the second gate contact, or a combination thereof being outside the gate cut region. Various aspects include providing the diffusion contact structure within a two-gate pitch region. Some aspects include the two-gate pitch region being 100 nm to 200 nm in length.

An additional aspect of the present disclosure is a device including: first and second gate structures over a substrate; a gate cut region across the first gate structure, the second gate structure, or a combination thereof; a first gate contact over the first gate structure; a second gate contact over the second gate structure; and a diffusion contact structure coupling the first gate contact to the second gate contact, the diffusion contact structure having vertices within the gate cut region.

Aspects include a device having the diffusion contact structure include: a first diffusion contact portion over the first gate structure; a second diffusion contact portion within the gate cut region; and a third diffusion contact portion over the second gate structure. Additional aspects include a device having the first diffusion contact portion being coupled to a first side of the second diffusion contact portion, the third diffusion contact portion being coupled to a second side of the second diffusion contact portion, and the second side being opposite the first side. Certain aspects include a device having the first diffusion contact portion being coupled to the first gate contact, and the third diffusion contact portion being coupled to the second gate contact. Some aspects include a device having the second diffusion contact portion that is perpendicular to the first diffusion contact portion, the third diffusion contact portion, or a combination thereof.

Further aspects include a device having the first gate contact, the second gate contact, or a combination thereof being outside the gate cut region. Various aspects include a device having the diffusion contact structure being within a two-gate pitch region. Some aspects include a device having the two-gate pitch region being 100 nm to 200 nm in length.

Another aspect of the present disclosure includes: providing first and second gate structures over a substrate; providing a gate cut region across the first gate structure, the second gate structure, or a combination thereof; providing a first gate contact over the first gate structure; providing a second gate contact over the second gate structure; providing a diffusion contact structure having a first diffusion contact portion over the first gate structure, a second diffusion contact portion within the gate cut region, and a third diffusion contact portion over the second gate structure; and coupling the diffusion contact structure to the first and second gate contacts.

Additional aspects include: coupling the first diffusion contact portion to a first side of the second diffusion contact portion; and coupling the third diffusion contact portion to a second side of the second diffusion contact portion, wherein the second side is opposite the first side. Some aspects include: coupling the first diffusion contact portion to the first gate contact; and coupling the third diffusion contact portion to the second gate contact, wherein the first gate contact, the second gate contact, or a combination thereof are outside the gate cut region. Further aspects include providing the diffusion contact structure within a two-gate pitch region that is 100 nm to 200 nm in length.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of low diffusion efficiency, reduced drive strength, and decreased reliability attendant upon cross-coupling gate contact structures. The present disclosure addresses and solves such problems, for instance, by, inter alia, providing a diffusion contact structure coupling a first gate contact over a first gate structure to the second gate contact over a second gate structure, with the diffusion contact structure having vertices within a gate cut region across the first gate structure, the second gate structure, or a combination thereof.

Figure 1:
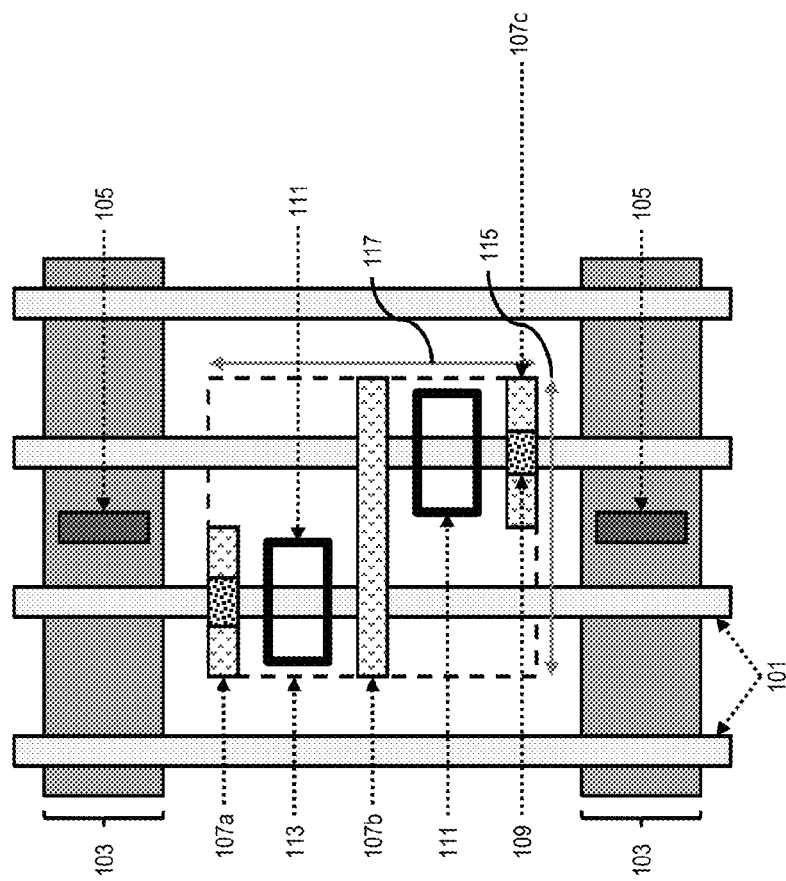
FIG. 1 schematically illustrates a typical cross-coupling-based design.
Figure 2:
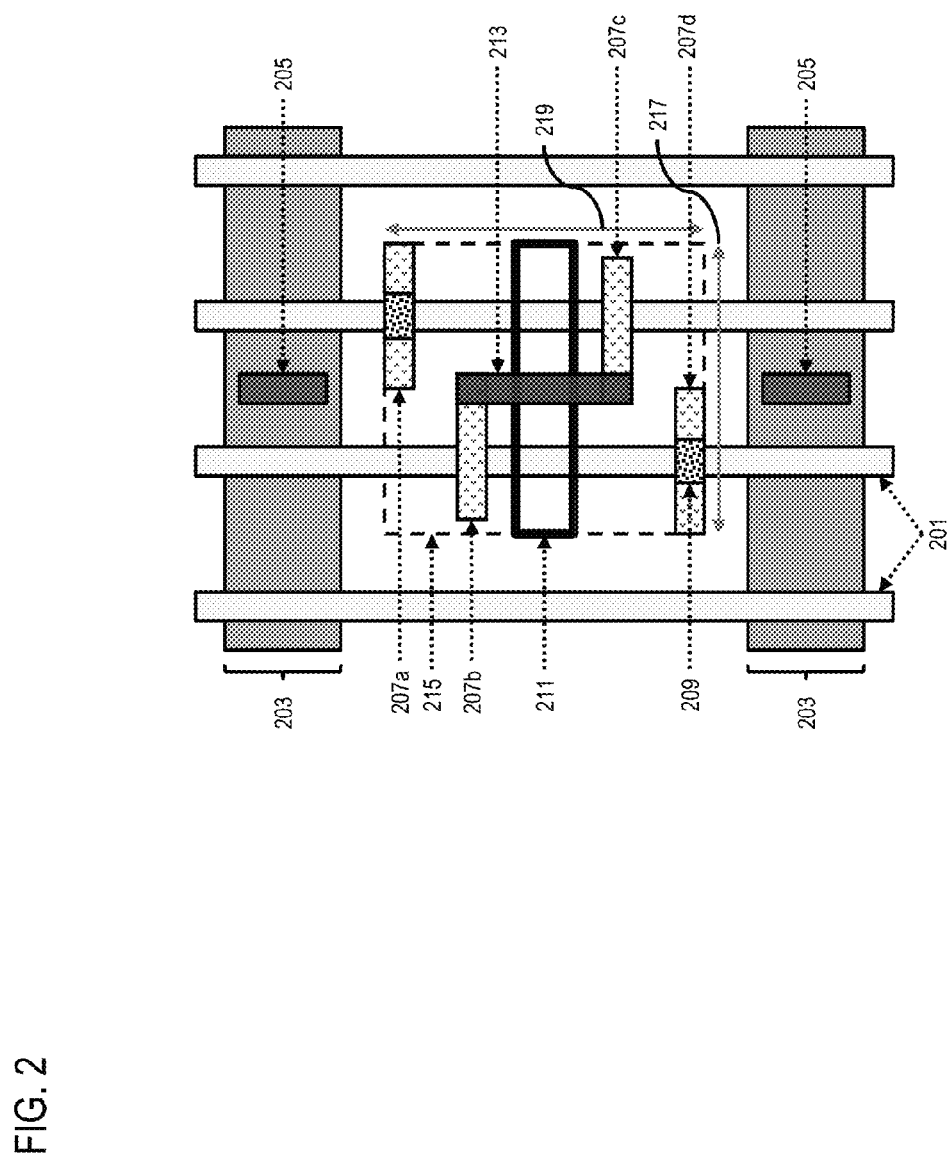
FIG. 2 schematically illustrates another cross-coupling-based design.
Figure 3:
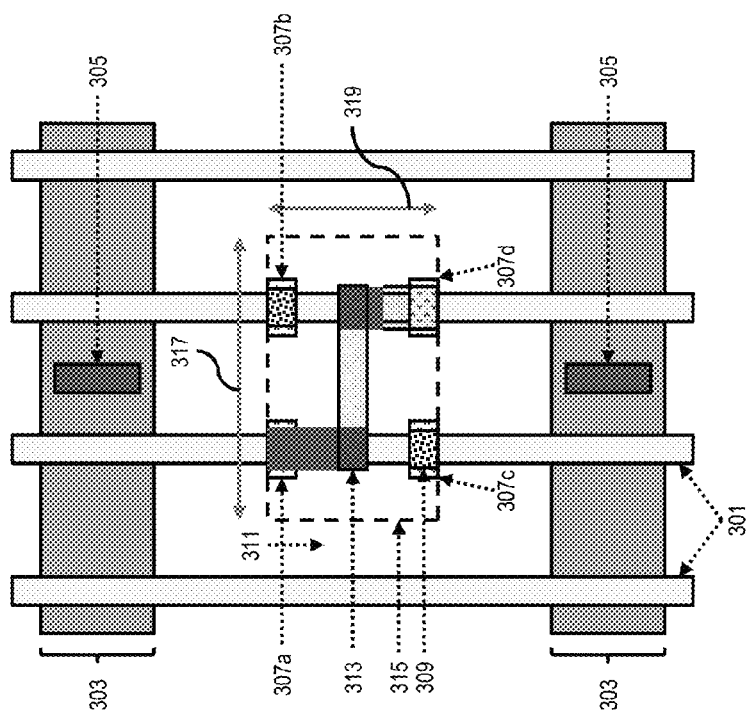
FIG. 3 schematically illustrates a cross-coupling-based design using diffusion contact structures, in accordance with an exemplary embodiment of the present disclosure.

FIG. 3 schematically illustrates a cross-coupling-based design using diffusion contact structures, in accordance with an exemplary embodiment of the present disclosure. As shown, the design in FIG. 3 includes gate structures 301 over one or more diffusion regions 303 having one or more diffusion contact structures 305. In certain aspects, the gate structures 301 may initially be formed with protective gap caps (not shown for illustrative convenience) that allow diffusion contact structures (e.g., diffusion contact structures 305) to overlap the gate structures 301 without shorting to the gate structures 301. During processing, a portion of the gate cap may be removed for a particular gate structure 301, for instance, to enable coupling of a diffusion contact structure, a gate contact structure (e.g., gate contact structures 307), etc., to that gate structure 301.

In addition, the design in FIG. 3 includes gate contact structures 307 (e.g., gate contact structures 307a through 307d) over gate structures 301, and via structures 309 to couple some of the gate contact structures 307 to the metal routing layer (not shown for illustrative convenience). As an example, the design in FIG. 3 utilizes gate cut region 311 across two of the gate structures 301 to separate the gate contact structures 307 of those gate structures 301, and diffusion contact structure 313 to couple gate contact structure 307a to gate contact structure 307d. As depicted, diffusion contact structure 313 crosses over gate cut region 311 to couple gate structures 307 (e.g., gate contact structures 307a and 307d) that are on opposite sides of the gate cut region 311 and on two different gate structures 301. In addition, diffusion contact structure 313 has vertices within gate cut region 311 and is made up of at least three diffusion contact portions (e.g., left portion, center portion, right portion, etc.).

It is noted, however, that diffusion contact structure 313 may be any shape for connecting the various gate contact structures 307. For example, as an alternative to the Z-shape structure in FIG. 3, the diffusion contact structure 313 may be a straight 45 degree structure (not shown for illustrative convenience) coupling gate contact structure 307a to gate contact structure 307d (e.g., where the structure begins over one gate structure 301, crosses over gate cut region 311 such that a middle portion is within the gate cut region, and ends over another gate structure 301). Moreover, with respect to the design in FIG. 3, two-gate pitch region 315 may have any suitable width (e.g., indicator 317), and a length of 100 nm to 200 nm (e.g., indicator 319). However, the two-gate pitch region 315 may alternatively have a length less than 100 nm or greater than 200 nm.

Nonetheless, embodiments of the present disclosure enable higher diffusion efficiency due to a shorter length (e.g., vertical dimension as shown by indicator 319) of the two-gate pitch region 315, for instance, when double patterning techniques are utilized for providing gate contact structures 307 and diffusion contact structures 313. Embodiments of the present disclosure also facilitate further scaling of standard cells without sacrificing device performance. Moreover, due to the simplicity of the gate contact structures 307, embodiments of the present disclosure are not prone to less yield or reliability concerns as a result of shorter spacing between adjacent gate structures 301, making such embodiments easier to manufacture. By way of example, the gate contact structures 307 may, for instance, be as small as 20 nm by 20 nm. In certain aspects, the size of the gate contact structure 307 in a layout design may be any suitable single gate contact size is for the technology generation on which the design is being implemented (e.g., since it is not necessary for the gate contact structures 307 to directly connect two gates, the gate contact structures 307 can have a traditional hole shape and be very small).

The embodiments of the present disclosure can achieve several technical effects, including increased diffusion efficiency, higher drive strength, and improved reliability. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly in 14 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
  first and second gate structures over a substrate;
  a gate cut region across the first gate structure, the second gate structure, or a combination thereof;
  a first gate contact over the first gate structure;
  a second gate contact over the second gate structure; and
  a diffusion contact structure coupling the first gate contact to the second gate contact, the diffusion contact structure having vertices within the gate cut region.

2. The device according to claim 1, wherein the diffusion contact structure includes:
  a first diffusion contact portion over the first gate structure;
  a second diffusion contact portion within the gate cut region; and
  a third diffusion contact portion over the second gate structure.

3. The device according to claim 2, wherein the first diffusion contact portion is coupled to a first side of the second diffusion contact portion, the third diffusion contact portion is coupled to a second side of the second diffusion contact portion, and the second side is opposite the first side.

4. The device according to claim 2, wherein the first diffusion contact portion is coupled to the first gate contact, and the third diffusion contact portion is coupled to the second gate contact.

5. The device according to claim 2, wherein the second diffusion contact portion is perpendicular to the first diffusion contact portion, the third diffusion contact portion, or a combination thereof.

6. The device according to claim 1, wherein the first gate contact, the second gate contact, or a combination thereof are outside the gate cut region.

7. The device according to claim 1, wherein the diffusion contact structure is within a two-gate pitch region.

8. The device according to claim 7, wherein the two-gate pitch region is 100 nm to 200 nm in length.

9. The device according to claim 1, further comprising a third gate contact over the first or second gate structure, and a via structure over the third gate contact.

10. A device comprising:
  plural gate structures over a substrate;
  a gate cut region across a first gate structure of the plural gate structures, a second gate structure of the plural gate structures, or a combination thereof;
  a first gate contact over the first gate structure, on a first side of the gate cut region;
  a second gate contact over the second gate structure, on a second side, opposite the first side, of the gate cut region;
  a third gate contact over the first or second gate structure and horizontally aligned with the first or second gate contact, respectively;
  a via structure over the third gate contact; and
  a diffusion contact structure within a two-gate pitch region coupling the first gate contact to the second gate contact, the diffusion contact structure having vertices within the gate cut region and comprising:
    a first diffusion contact portion over the first gate structure, coupled to the first gate contact,
    a second diffusion contact portion within the gate cut region, and
    a third diffusion contact portion over the second gate structure, coupled to the second gate contact, wherein the first diffusion contact portion is coupled to a first side of the second diffusion contact portion, the third diffusion contact portion is coupled to a second side of the second diffusion contact portion, and the second side is opposite the first side.

11. The device according to claim 10, wherein the two-gate pitch region is 100 nm to 200 nm in length.

12. A device comprising:
  first and second gate structures over a substrate;
  a gate cut region across the first gate structure, the second gate structure, or a combination thereof;
  a first gate contact over the first gate structure, on a first side of the gate cut region;
  a second gate contact over the second gate structure, on a second side, opposite the first side, of the gate cut region;

a third gate contact over the first or second gate structure and horizontally aligned with the first or second gate contact, respectively; and a diffusion contact structure coupling the first gate contact to the second gate contact, the diffusion contact structure having vertices within the gate cut region.

13. The device according to claim 12, wherein the diffusion contact structure includes:

a first diffusion contact portion over the first gate structure; a second diffusion contact portion within the gate cut region; and a third diffusion contact portion over the second gate structure.

14. The device according to claim 13, wherein the first diffusion contact portion is coupled to a first side of the second diffusion contact portion, the third diffusion contact portion is coupled to a second side of the second diffusion contact portion, and the second side is opposite the first side.

15. The device according to claim 13, wherein the first diffusion contact portion is coupled to the first gate contact, and the third diffusion contact portion is coupled to the second gate contact.

16. The device according to claim 13, wherein the second diffusion contact portion is perpendicular to the first diffusion contact portion, the third diffusion contact portion, or a combination thereof.

17. The device according to claim 12, wherein the first gate contact, the second gate contact, or a combination thereof are outside the gate cut region.

18. The device according to claim 12, wherein the diffusion contact structure is within a two-gate pitch region.

19. The device according to claim 18, wherein the two-gate pitch region is 100 nm to 200 nm in length.

20. The device according to claim 12, further comprising a via structure over the third gate contact.

* * * * *